US010216163B2

United States Patent
Nishi et al.

(10) Patent No.: US 10,216,163 B2
(45) Date of Patent: Feb. 26, 2019

(54) MANUFACTURING SYSTEM FOR DRIVING PLURAL TYPES OF MANUFACTURING APPARATUSES WITH PROGRAM BASED ON COMMON LANGUAGE SPECIFICATION

(71) Applicant: FANUC CORPORATION, Yamanashi (JP)

(72) Inventors: Hiroji Nishi, Yamanashi (JP); Shinsuke Sakakibara, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 32 days.

(21) Appl. No.: 15/417,211

(22) Filed: Jan. 26, 2017

(65) Prior Publication Data

US 2017/0220017 A1    Aug. 3, 2017

(30) Foreign Application Priority Data

Jan. 29, 2016 (JP) ................................. 2016-015443

(51) Int. Cl.
*G06F 19/00* (2018.01)
*G05B 19/042* (2006.01)
*G06F 17/50* (2006.01)

(52) U.S. Cl.
CPC ..... *G05B 19/0426* (2013.01); *G06F 17/5009* (2013.01); *G05B 2219/23243* (2013.01)

(58) Field of Classification Search
CPC combination set(s) only.
See application file for complete search history.

(56) References Cited

U.S. PATENT DOCUMENTS

| 5,378,218 A * | 1/1995 | Daimaru | G05B 19/40938 483/8 |
| 2005/0022060 A1* | 1/2005 | Hashimoto | G05B 19/0428 714/37 |

(Continued)

FOREIGN PATENT DOCUMENTS

| JP | 5-216524 A | 8/1993 |
| JP | 6-238580 A | 8/1994 |

(Continued)

OTHER PUBLICATIONS

Easy-Rob, Convert of NC-code into a robot program, Oct. 2017, EASR-Rob 3D robot simulation tool, pp. 1-12.*

*Primary Examiner* — Kidest Bahta
(74) *Attorney, Agent, or Firm* — Hauptman Ham, LLP

(57) ABSTRACT

A manufacturing system comprises plural types of manufacturing apparatuses driven by operation programs of which language specifications differ from each other. The manufacturing system comprises a cell control apparatus which generates the operation program to be executed in the manufacturing apparatus and communication apparatuses which send the operation programs generated by the cell control apparatus to the respective manufacturing apparatuses. A language specification common to the manufacturing apparatuses of which the types differ from each other is predetermined. The cell control apparatus includes a reading part which reads a common program generated based on the common language specification and a conversion part which converts the common program into the operation programs for the respective manufacturing apparatuses.

6 Claims, 9 Drawing Sheets

(56) References Cited

U.S. PATENT DOCUMENTS

| | | | | |
|---|---|---|---|---|
| 2007/0233452 A1* | 10/2007 | Sasaki | ............... | G06F 17/5009 703/22 |
| 2007/0299642 A1* | 12/2007 | Kondo | ............... | G06F 17/5009 703/6 |
| 2009/0106005 A1* | 4/2009 | Kondo | ............... | G06F 17/5009 703/7 |
| 2013/0166068 A1* | 6/2013 | Yanagita | ............ | G05B 19/4083 700/245 |
| 2014/0172148 A1* | 6/2014 | Miller | ............... | G05B 19/414 700/183 |
| 2014/0364989 A1* | 12/2014 | Hosaka | ............ | G05B 19/41825 700/159 |
| 2015/0241863 A1* | 8/2015 | Lewin | ............... | H04R 1/005 700/275 |

FOREIGN PATENT DOCUMENTS

| | | |
|---|---|---|
| JP | 6-270084 A | 9/1994 |
| JP | H6-318105 A | 11/1994 |
| JP | 7-168617 A | 7/1995 |
| JP | 9-44219 A | 2/1997 |
| JP | H9-171405 A | 6/1997 |
| JP | 9-305213 A | 11/1997 |
| JP | 10-264058 A | 10/1998 |
| JP | 2003-108220 A | 4/2003 |
| JP | 2006-99587 A | 4/2006 |
| JP | 2007-164417 A | 6/2007 |
| JP | 2011-70539 A | 4/2011 |
| JP | 2013-134786 A | 7/2013 |
| JP | 2014-241018 A | 12/2014 |

* cited by examiner

MANUFACTURING SYSTEM FOR DRIVING PLURAL TYPES OF MANUFACTURING APPARATUSES WITH PROGRAM BASED ON COMMON LANGUAGE SPECIFICATION

RELATED APPLICATIONS

The present application claims priority to Japanese Patent Application Number 2016-015443 filed Jan. 29, 2016, the disclosure of which is hereby incorporated by reference herein in its entirety.

BACKGROUND OF THE INVENTION

1. Field of the Invention

The present invention relates to a manufacturing system comprising plural types of manufacturing apparatuses.

2. Description of the Related Art

In manufacturing systems arranged in factories and the like, manufacturing apparatuses are known to carry out operations such as component working and transportation, thereby improving productivity. In manufacturing systems, different types of manufacturing apparatuses are used, or plural manufacturing apparatuses of which the type is the same are used. When plural manufacturing apparatuses are used, the plural manufacturing apparatuses share operations to manufacture products.

A machine tool, a robotic apparatus, and a programmable logic controller (PLCs) are used as manufacturing apparatuses in many manufacturing systems. Working of products can be automated by using the machine tool, the robotic apparatus, and the PLC.

In order to work products by the machine tool, the operator needs to generate a machining program in accordance with the details of the working by the machine tool. The machining program is commonly generated using NC programming language. In order to carry out an operation in the robotic apparatus, the operator needs to generate a robot program in accordance with the details of the operation of the robotic apparatus. The robot program is commonly generated using robot language. In order to drive PLC, the operator needs to generate a ladder program (sequence program) in accordance with operation sequence. The ladder program is commonly generated using ladder language.

Japanese Unexamined Patent Publication No. 5-216524A discloses a robot that interprets and executes a robot language program and an NC language program as internal processing data in one control apparatus. Japanese Unexamined Patent Publication No. 9-305213A discloses a robot control apparatus that switches and uses a robot language program and an NC language program in one control apparatus.

Japanese Unexamined Patent Publication No. 2013-134786A discloses a robot control apparatus that converts an NC program into a robot language according to a conversion configuration table. In addition, it is disclosed that the robot control apparatus executes the converted robot language. Japanese Unexamined Patent Publication No. 7-168617A discloses a method for converting a language program for a simulation produced by a robot simulation system into a robot language program. Japanese Unexamined Patent Publication No. 6-238580A discloses a program generation method in which a unified robot language is produced and rewritten into a different type of robot language by a programming apparatus.

SUMMARY OF THE INVENTION

The NC programming language used in the machining program for the machine tool, the robot language used in the robot program for the robotic apparatus, and the ladder language used in the ladder program for the PLC are programming languages of which the language specifications differ from each other.

Therefore, it is necessary to generate programs of which the language specifications differ from each other in a manufacturing system comprising the machine tool, the robotic apparatus, and the PLC. A user of the manufacturing system needs to learn the language specifications of the machine tool, the robotic apparatus, and the PLC so as to be capable of generating each program.

Commonly, it is difficult for one operator to learn all language specifications. The operator generating a program is assigned for each manufacturing apparatus. Learning of language specifications is shared among plural operators. In order to operate a manufacturing system, the details of the programs for manufacturing apparatuses needs to be determined among operators for the respective manufacturing apparatuses. The operators need to generate the programs in accordance with the determined details of the programs.

The details of the program include the details of the operation carried out by each manufacturing apparatus, the details of communication between the manufacturing apparatuses, and the like. However, the operator may misunderstand the details of a program and generate the program. Alternatively, the details of the programs determined among operators may be incorrect. As a result, a manufacturing system may incorrectly work, and therefore, the programs need to be corrected. In the correction of the programs, not only the correction of the program for the manufacturing apparatus having a problem but also the correction of the program for another manufacturing apparatus may be preferred. Alternatively, the allocation of the digital signals of a field network may be corrected in order to change the details of communications between manufacturing apparatuses. It is necessary to request the operator to correct the programs for respective manufacturing apparatuses depending on the details of the correction of the programs, and the schedules of the operators may be adjusted.

As described above, programs for plural types of manufacturing apparatuses such as the machine tool, the robotic apparatus, and the PLC are formed based on different languages, and it is necessary to use a network in order to receive and send data between the manufacturing apparatuses or to set an interlock. Therefore, much effort to generate and correct the programs for the manufacturing apparatuses is required. As a result, the generation and correction of the programs may have entailed a great cost, and a manufacturing system may have been unprofitable. For example, when plural types of products have been manufactured, much effort has been required because it is necessary to generate or correct the program whenever adding a type of a product.

It is necessary to stop manufacture of a product when the program for the manufacturing apparatus is generated or corrected. As a result, the rate of operation of the manufacturing system is decreased. A method for confirming the operations of plural manufacturing apparatuses using a simulator without operating an actual manufacturing system is conceivable.

However, it is necessary to individually execute a simulation for all of programs for the machine tool, the robotic apparatus, and the PLC. Further, a high-performance simulator is needed in order to carry out the simulation of the communication of data and the interlock between the manufacturing apparatuses.

A manufacturing system of the present invention comprises plural types of manufacturing apparatuses driven by operation programs of which the language specifications differ from each other. The manufacturing system comprises a program generation apparatus which generates operation programs to be executed in the manufacturing apparatuses and sending apparatuses which send the operation programs generated by the program generation apparatus to respective manufacturing apparatuses. The manufacturing system comprises a communication apparatus for carrying out a communication between the manufacturing apparatuses. A language specification common to the manufacturing apparatuses of which the types differ from each other is predetermined. The program generation apparatus includes a reading part which reads a common program generated based on the common language specification and a conversion part which converts the common program into the operation programs for respective manufacturing apparatuses.

In the invention described above, the conversion part can has a function of automatically adding a command for carrying out a communication of information or a signal between the manufacturing apparatuses when the common program is converted into the operation programs for the manufacturing apparatuses.

In the invention described above, the manufacturing system can comprise a simulation apparatus which executes a simulation of the common program input into the program generation apparatus.

DETAILED DESCRIPTION

With reference to FIG. 1 to FIG. 9, manufacturing systems in embodiments will be described. A manufacturing system of the present embodiment comprises plural manufacturing apparatuses for manufacturing a product. Further, the manufacturing system of the present embodiment comprises plural types of manufacturing apparatuses. In the present embodiment, a robotic apparatus, a machine tool, and a PLC are taken as an example, and are described as the manufacturing apparatuses. The robotic apparatuses, the machine tools, and the PLC are manufacturing apparatuses of which the details of the operations differ from each other, and of which the types differ from each other.

Figure 1:
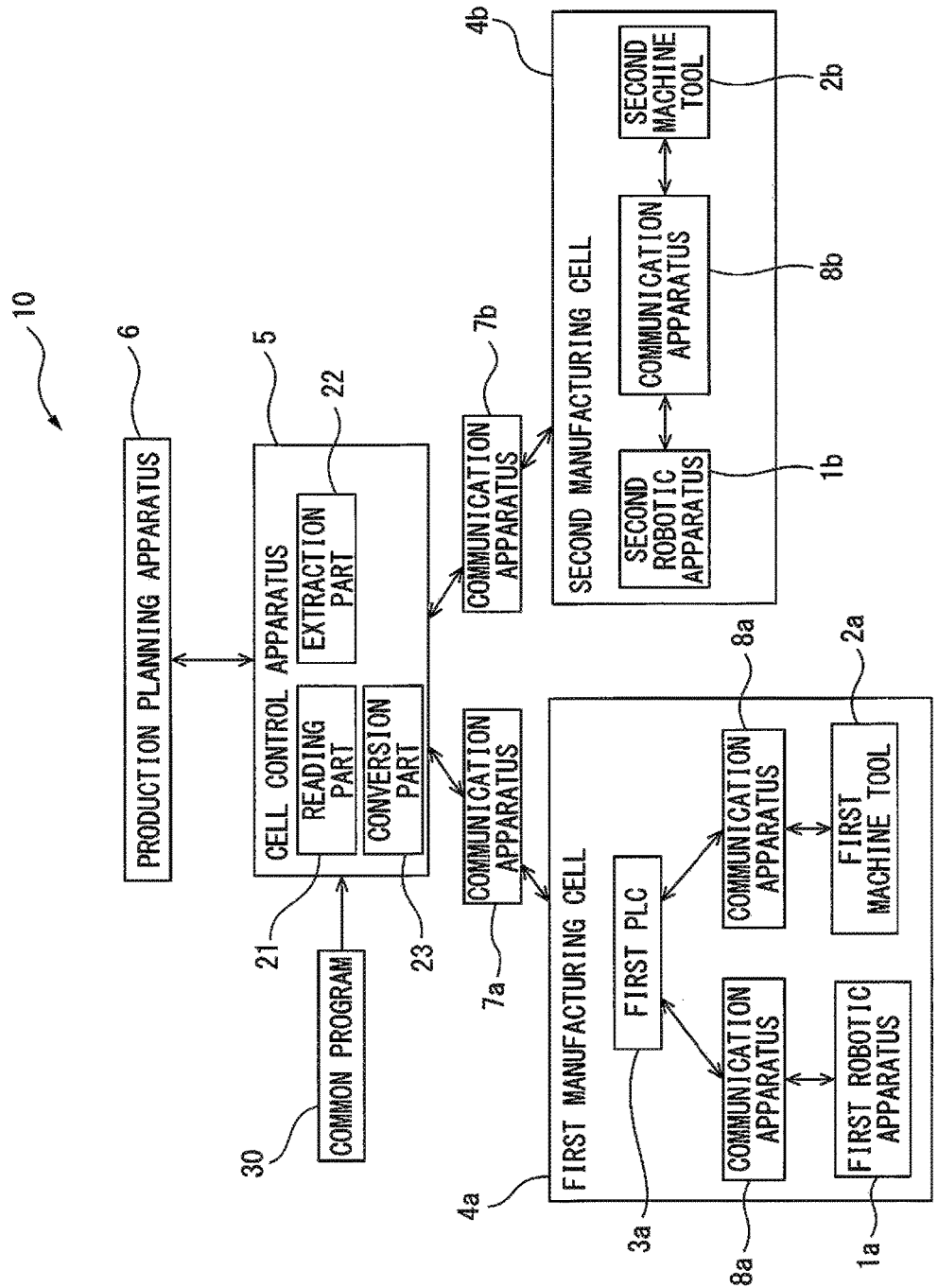
FIG. 1 is a block diagram of first manufacturing system in an embodiment.

FIG. 1 is a block diagram of first manufacturing system in the present embodiment. A manufacturing system 10 comprises plural manufacturing cells 4a, 4b. In the example illustrated in FIG. 1, the manufacturing system 10 comprises first manufacturing cell 4a and second manufacturing cell 4b. The manufacturing cell forms one aggregation for carrying out a predetermined operation. The manufacturing cells can be set by an arbitrary method. For example, one manufacturing cell is set for carrying out one manufacturing step. Alternatively, similar operations are collected and the manufacturing cell is set for the operations.

The manufacturing cells 4a, 4b of the present embodiment include plural manufacturing apparatuses. The first manufacturing cell 4a includes first robotic apparatus 1a, first machine tool 2a, and first PLC 3a. The second manufacturing cell 4b includes second robotic apparatus 1b and second machine tool 2b. Each manufacturing apparatus comprises a control apparatus which controls the manufacturing apparatus.

The machine tools 2a, 2b in the present embodiment are numerically controlled. The machine tools 2a, 2b can subject a workpiece to working such as cutting by relatively moving a tool with respect to the workpiece. The machine tools 2a, 2b include a body part in which the tool and a table are arranged and a machine control apparatus which controls the body part. The robotic apparatuses 1a, 1b arrange, in the machine tools 2a, 2b, a workpiece to be worked by the machine tools 2a, 2b, and take out the workpiece worked in the machine tools 2a, 2b. The robotic apparatuses 1a, 1b include a hand which grips a workpiece, a robot having an arm which moves the hand, and a robot control apparatus which controls the hand and the robot.

The PLC is used to operate the plural manufacturing apparatuses in a predetermined sequence. The operations of the PLC include an operation of transmitting a command for an operation to the predetermined manufacturing apparatus and an operation of receiving a signal of the end of the operation from the predetermined manufacturing apparatus. In the present embodiment, the first PLC 3a is arranged in the first manufacturing cell 4a. The first PLC 3a controls the sequence of operations carried out by the first machine tool 2a and the first robotic apparatus 1a. The first PLC 3a transmits instructions for executing a machining program and a robot program to the first machine tool 2a and the first robotic apparatus 1a, and receives operation results.

For example, the first PLC 3a transmits an instruction for preparing working to the first machine tool 2a when receiving a working request from a cell control apparatus 5. The first PLC 3a transmits an instruction for attaching a workpiece to the first robotic apparatus 1a when receiving a report that the preparation for the working has been completed from the first machine tool 2a. The first PLC 3a transmits an instruction for starting working of the workpiece to the first machine tool 2a when receiving a report that the attachment of the workpiece has been completed from the first robotic apparatus 1a. The first PLC 3a transmits an instruction for taking out the workpiece from the first machine tool 2a to the first robotic apparatus 1a when receiving a report that the working has been completed from the first machine tool 2a. The first PLC 3a judges that one working step has been completed when receiving a report that the workpiece has been taken out from the first robotic apparatus 1a. The first PLC 3a receives a new working request.

In the first manufacturing cell 4a, the first PLC 3a is connected to the robot control apparatus of the first robotic apparatus 1a via a communication apparatus 8a. The first PLC 3a is connected to the machine control apparatus of the first machine tool 2a via the communication apparatus 8a. The first PLC 3a is formed to be capable of communicating information and a signal with the first robotic apparatus 1a and the first machine tool 2a. In the second manufacturing cell 4b, no PLC is arranged, and the robot control apparatus of the second robotic apparatus 1b and the machine control apparatus of the second machine tool 2b are connected to each other via a communication apparatus 8b. The second robotic apparatus 1b and the second machine tool 2b are formed to be capable of communicating information and a signal with each other.

The manufacturing system 10 comprises a cell control apparatus 5 as a manufacturing management apparatus which controls the manufacturing cells 4a, 4b. The cell control apparatus 5 includes an arithmetic processing unit having a CPU (central processing unit), a RAM (random access memory), a ROM (read only memory), and the like that are connected to one another via buses. The cell control apparatus 5 is connected to the first PLC 3a, the robot control apparatus of the first robotic apparatus 1a, and the machine control apparatus of the first machine tool 2a via a communication apparatus 7a. Further, the cell control apparatus 5 is connected to the robot control apparatus of the second robotic apparatus 1b and the machine control apparatus of the second machine tool 2b via a communication apparatus 7b.

The cell control apparatus 5 acquires the operation states of the manufacturing apparatuses from the control apparatuses of the manufacturing apparatuses, and delivers commands for executing the operation programs to the control apparatuses of the manufacturing apparatuses. Operation commands (codes) for driving the manufacturing apparatuses are described in the operation programs. The cell control apparatus 5 of the present embodiment is formed to generate the operation programs for respective manufacturing apparatuses and to deliver the operation programs to the manufacturing apparatuses. The communication apparatuses 7a, 7b function as sending apparatuses which send the operation programs generated by the cell control apparatus 5 to respective manufacturing apparatuses.

The manufacturing system 10 comprises a production planning apparatus 6 which sets a plan of manufacturing of a product. The production planning apparatus 6 is formed to be capable of communicating with the cell control apparatus 5. The production planning apparatus 6 in the present embodiment manages production of products in an entire factory.

Digital signals including a binary of ON and OFF are used in the communications among the machine tool, the robotic apparatus, and the PLC. For example, the digital signal can be transmitted and received by connecting the machine tool and the PLC to each other through a field network and by further connecting the robotic apparatus and the PLC to each other.

In the present embodiment, the manufacturing cells 4a, 4b are arranged in a factory for manufacturing a product. In contrast, the cell control apparatus 5 and the production planning apparatus 6 may be arranged in a building different from the factory. For example, the cell control apparatus 5 may be arranged in another building in the site of the factory. In such a case, the cell control apparatus 5 and the manufacturing cells 4a, 4b can be connected to each other, for example, through a network such as an intranet. The production planning apparatus 6 may be arranged in an office arranged in an area apart from the factory. The production planning apparatus 6 and the cell control apparatus 5 are connected to communicate with each other, for example, through a network such as the Internet.

Figure 2:
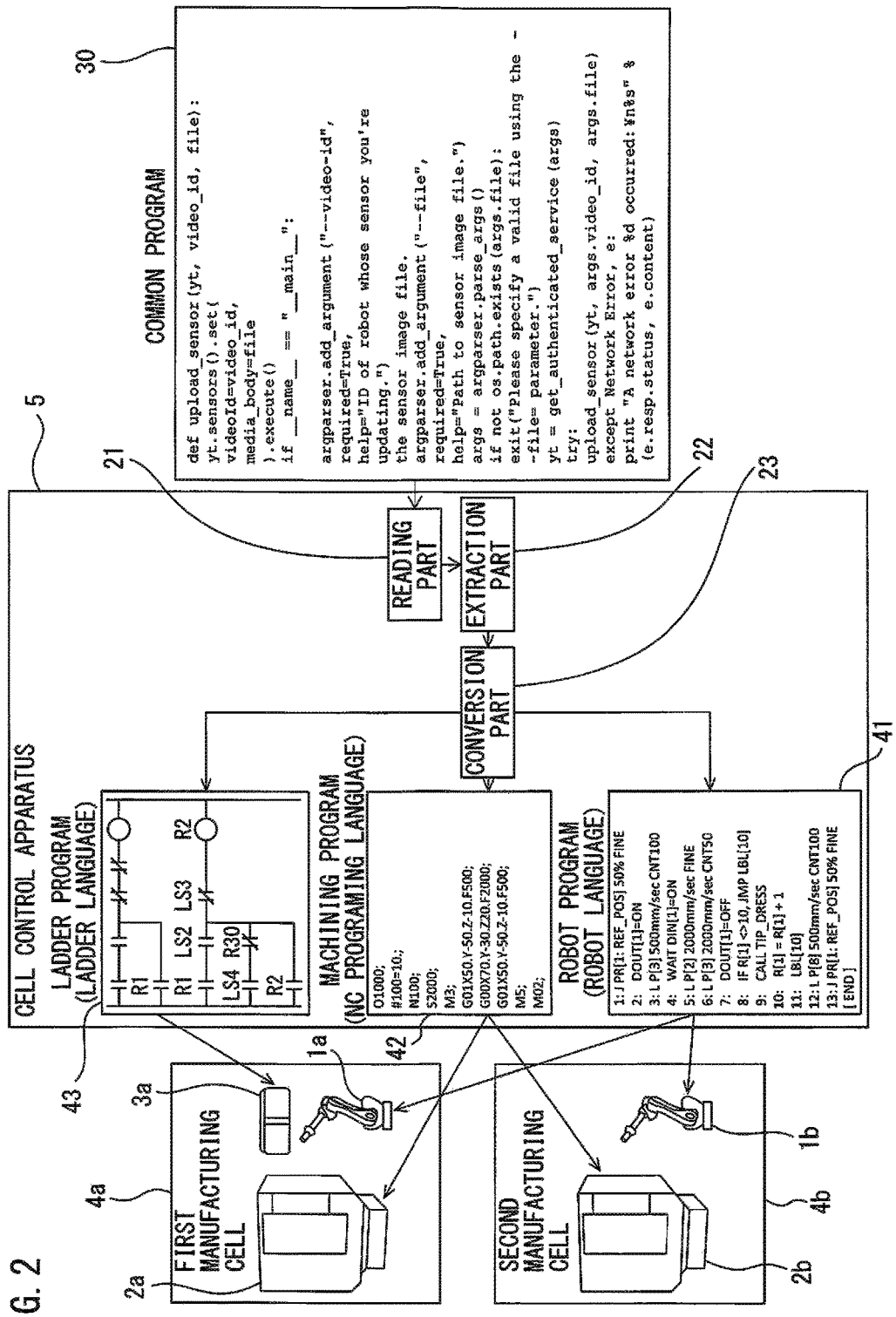
FIG. 2 is a schematic view for explaining control of generation of operation programs for the manufacturing system.

FIG. 2 shows a schematic view for explaining the flows of programs in the manufacturing system of the present embodiment. The manufacturing system in the present embodiment comprises the plural types of the manufacturing apparatuses. Each manufacturing apparatus is driven based on an operation program generated in advance.

The robotic apparatuses 1a, 1b are driven by a robot program 41 described based on a robot language. The machine tools 2a, 2b are driven by a machining program 42 described based on a NC (numerical control) programming language. Further, the PLC 3a is driven by a ladder program 43 described based on a ladder language. As described above, the plural manufacturing apparatuses are driven by the operation programs of which the language specifications differ from each other.

The manufacturing system 10 in the present embodiment comprises a program generation apparatus which generates the operation programs to be executed in the manufacturing apparatuses. In the present embodiment, the cell control apparatus 5 functions as the program generation apparatus.

In the manufacturing system 10 of the present embodiment, one common language specification for driving manufacturing apparatuses of which the types differ from each other is predetermined. In the present invention, a language determined by the common language specification is referred to as a common language. In the present invention, a program described based on the common language is referred to as a common program. A code as a command for driving each manufacturing apparatus using a common language is described in a common program 30. As described above, the common program 30 is generated based on a language common to the plural manufacturing apparatuses.

With reference to FIG. 1 and FIG. 2, the cell control apparatus 5 of the present embodiment generates the robot programs 41 for driving the robotic apparatuses 1a, 1b based on the common program 30. The cell control apparatus 5 generates the machining programs 42 for driving the machine tools 2a, 2b based on the common program 30. Further, the cell control apparatus 5 generates the ladder program 43 for driving the PLC 3a based on the common program 30.

Figure 3:
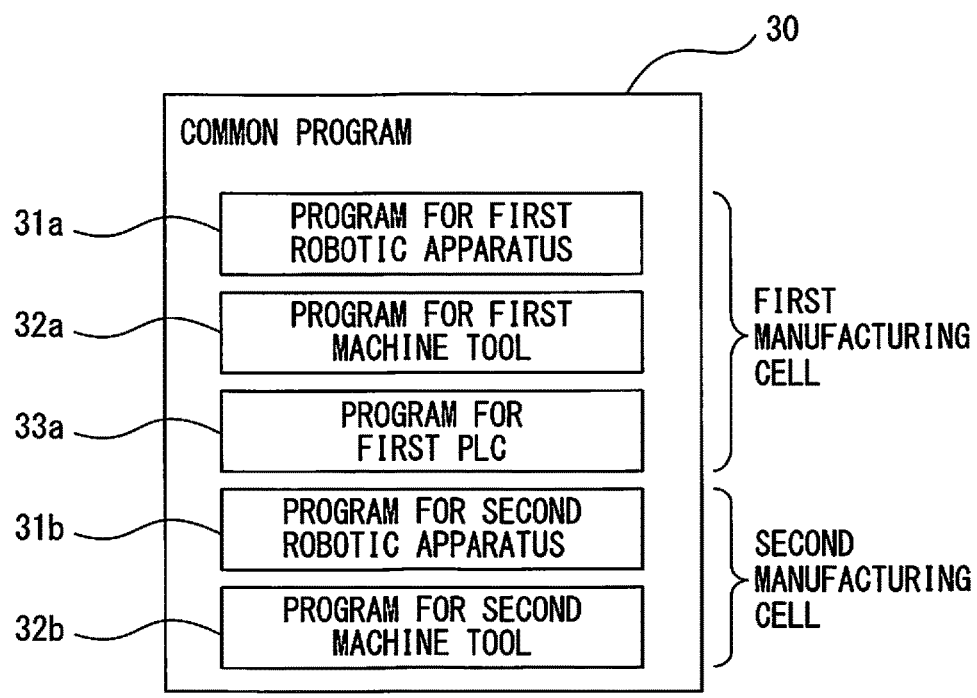
FIG. 3 is a block diagram of the configuration of a common program.

FIG. 3 shows a schematic view of the common program in the present embodiment. A program for driving each manufacturing apparatus is described in the common program 30. In the example illustrated in FIG. 3, programs are described separately based on each of the manufacturing cells 4a, 4b. In relation to the first manufacturing cell 4a, the common program 30 includes a program 31a of the first robotic apparatus for driving the first robotic apparatus 1a, a program 32a of the first machine tool for driving the first machine tool 2a, and a program 33a of the first PLC for driving the first PLC 3a. In relation to the second manufacturing cell 4b, the common program 30 includes a program 31b of the second robotic apparatus for driving the second robotic apparatus 1b, and a program 32b of the second machine tool for driving the second machine tool 2b. In the beginning of the program for each manufacturing apparatus, a command specifying the manufacturing apparatus is described. In the program for each manufacturing apparatus, a command for driving the manufacturing apparatus is described.

Although the programs for the manufacturing apparatuses are described based on each manufacturing cell in the example in FIG. 3, the common program 30 can be described in an arbitrary sequence without being limited to this configuration.

With reference to FIG. 1 and FIG. 2, the common program 30 is generated in advance and input into the cell control apparatus 5 by an operator. Alternatively, the common program 30 may be sent from the production planning apparatus 6 to the cell control apparatus 5. The common program 30 is stored in a storage part in the cell control apparatus 5. The cell control apparatus 5 includes a reading part 21 which reads the common program 30. The reading part 21 reads the common program. The cell control apparatus 5 includes an extraction part 22. The extraction part 22 extracts a portion of the program corresponding to the respective manufacturing apparatuses from the common program 30.

Figure 4:
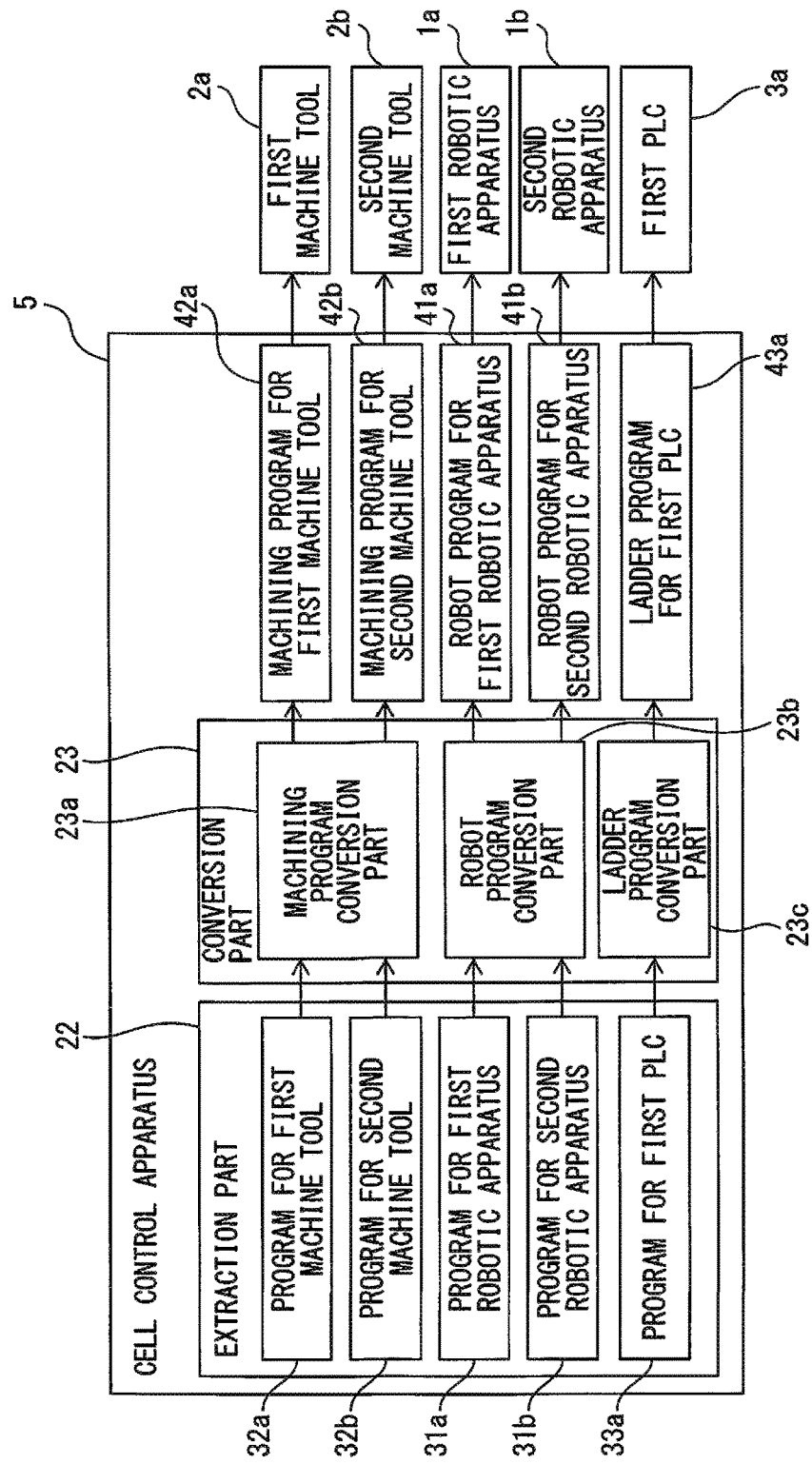
FIG. 4 is a block diagram for explaining the functions of an extraction part and a conversion part in a cell control apparatus.

FIG. 4 shows a block diagram for explaining the extraction part and the conversion part in the cell control apparatus. The extraction part 22 extracts the operation programs corresponding to the respective manufacturing apparatuses. For example, the extraction part 22 extracts the program 32a for the first machine tool from the common program 30. Then, the extraction part 22 extracts the program 32b for the second machine tool from the common program 30. As described above, with regard to the other manufacturing apparatuses also, the programs for the manufacturing apparatuses described based on the common language are extracted for respective manufacturing apparatuses.

The cell control apparatus 5 includes a conversion part 23 which converts a command described based on the common language of the common program 30 into the operation program for each manufacturing apparatus. The conversion part 23 includes a machining program conversion part 23a which converts a command for the machine tools in the common program 30 into the machining program. The machining program conversion part 23a converts a portion of the common program described based on the common language into a machining program described based on the NC programming language. The machining program conversion part 23a converts the program 32a for the first machine tool into a machining program 42a for the first machine tool. The machining program conversion part 23a converts the program 32b for the second machine tool into a machining program 42b for the second machine tool.

The conversion part 23 includes a robot program conversion part 23b which converts a command for the robotic apparatus in the common program 30 into the robot program. The robot program conversion part 23b converts a portion of the common program described based on the common language into a robot program described based on the robot language. The robot program conversion part 23b converts the program 31a for the first robotic apparatus into a robot program 41a for the first robotic apparatus. Further, the robot program conversion part 23b converts the program 31b for the second robotic apparatus into a robot program 41b for the second robotic apparatus.

With regard to the first PLC 3a, the conversion part 23 similarly includes a ladder program conversion part 23c which converts a command for the PLC in the common program 30 into a ladder program. The ladder program conversion part 23c converts a portion of the common program described based on the common language into a ladder program described based on the ladder language. The ladder program conversion part 23c converts the program 33a for the first PLC into a ladder program 43a for the first PLC.

As described above, the conversion part 23 in the cell control apparatus 5 generates the operation programs for respective manufacturing apparatuses based on the common program 30. The cell control apparatus 5 sends the operation programs to the respective manufacturing apparatuses via the communication apparatuses 7a, 7b. For example, the cell control apparatus 5 sends the machining program 42a for the first machine tool to the first machine tool 2a. The cell control apparatus 5 sends the robot program 41a for the first robotic apparatus to the first robotic apparatus 1a.

Portions for the robotic apparatuses, portions for the machine tools, and a portion for the PLC coexist and are described in the common program 30. The extraction part 22 in the cell control apparatus 5 can extract the portions corresponding to the respective manufacturing apparatuses from the common program 30. For each manufacturing apparatus, the conversion part 23 can convert the common program 30 into the operation program with the language specifications corresponding to the manufacturing apparatus. In the manufacturing apparatuses, the operation programs are processed by a compiler or an interpreter, and the manufacturing apparatuses are then driven.

In the manufacturing system of the present embodiment, the programs for driving the machine tools, the robotic apparatuses, and the PLC can be described based on one language. Therefore, the operator can generate a common program including commands for plural types of manufacturing apparatuses and commands for plural manufacturing apparatuses by learning one language specification. Even when a problem is found in the common program, the problem can be addressed by correcting the one common program. Therefore, the effort of the operator to generate and correct the program can be reduced.

The program may be corrected in a case in which a product to be manufactured is changed. The operator can address the case by correcting the common program. The operator does not need to change the setting of the communications of the information and the signal between the manufacturing apparatuses, the setting of the interlock, or the like depending on the content of the correction. Further, the operator does not need to change allocation of digital signals in a field network. Therefore, the effort of the operator can be reduced even when the product is changed. Alternatively, a new product type can be added with slight effort in the manufacturing system of the present embodiment.

In the manufacturing system of the present embodiment, the programs for driving the manufacturing apparatuses can be easily generated or corrected, and the effort of the operator can be reduced, as described above. Further, time during which manufacture of a product is stopped when the programs are generated or corrected can be shortened because the programs can be easily generated or corrected. As a result, reduction in the rate of operation of the manufacturing system can be suppressed.

Figure 5:
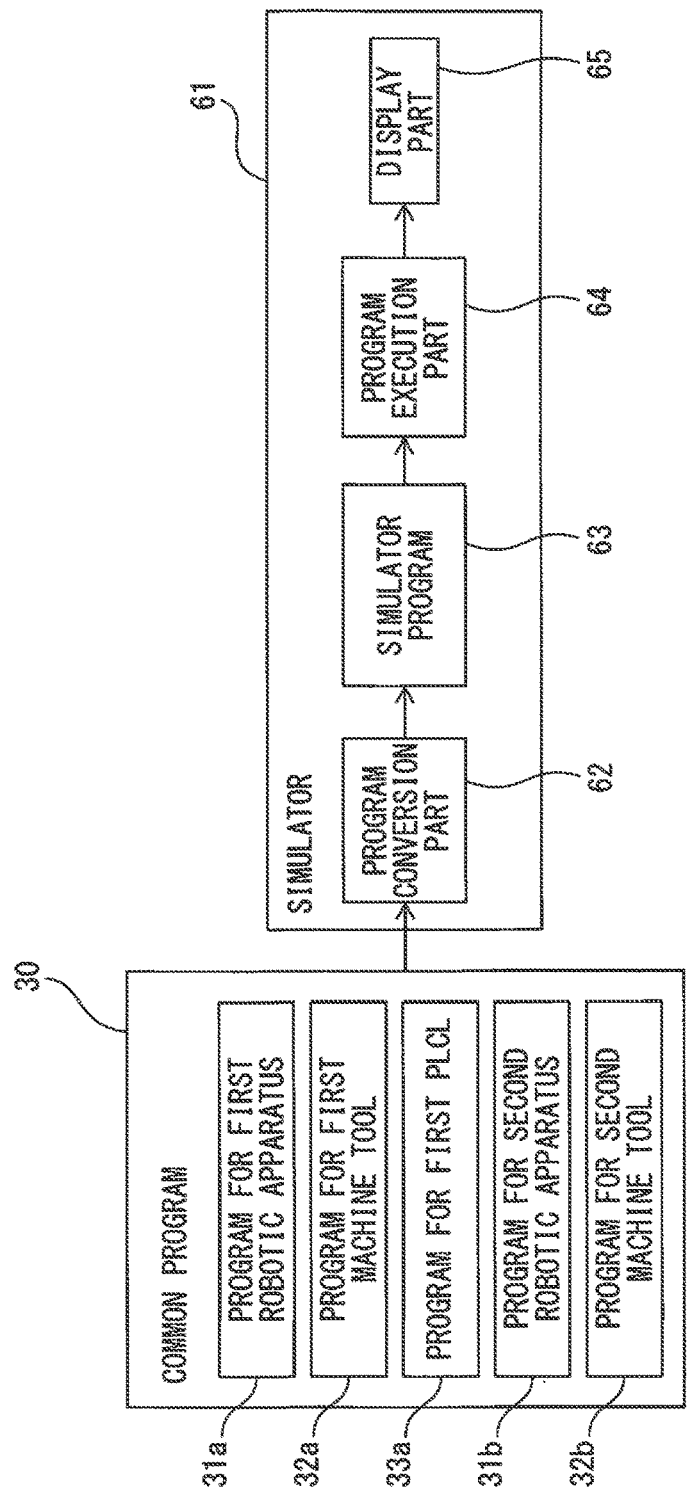
FIG. 5 is a block diagram of a simulator in an embodiment.

FIG. 5 shows a block diagram of a simulator of the present embodiment. The manufacturing system 10 of the present embodiment comprises a simulator 61 as a simulation apparatus which executes a simulation of the common program 30. The common program 30 is input into the simulator 61. In other words, a program described based on a common language is input into the simulator 61. The simulator 61 comprises a program conversion part 62 which reads the common program 30 and generates a simulator program 63.

The simulator 61 includes a program execution part 64 which executes the simulator program 63. The program execution part 64 carries out a simulation based on the simulator program 63. A display part 65 displays the results of the simulation.

The manufacturing system 10 comprises the simulator 61, whereby the operation of each manufacturing apparatus can be confirmed before actually operating the manufacturing system 10. It can be judged in advance whether or not an abnormality occurs when the plural manufacturing apparatuses are operated using the common program 30. The operator can correct the common program 30 when the abnormality occurs in the operation of the manufacturing apparatuses. The operator can repeat the simulation until no abnormality occurs.

The simulator 61 in the present embodiment does not need to interpret plural operation programs described based on languages different from each other because of generating the simulator program 63 based on the one common program 30. The simulation of the interlock between the manufacturing apparatuses and the simulation of the communication of the information can be easily executed because commands for all the manufacturing apparatuses are included in the common program. Therefore, use of a high-performance simulator 61 is not needed. The simulator 61 is provided, whereby it is not necessary to stop manufacture of a product in order to confirm the operation of the manufacturing apparatuses, and reduction in the rate of the operation of the manufacturing system can be suppressed. The manufacturing system may not comprise the simulation apparatus.

With regard to the operations carried out by a manufacturing system, the operations may be carried out in turn or simultaneously by plural manufacturing apparatuses. In many operations, the cooperation of plural manufacturing apparatuses is needed for the operations. The conversion part of the cell control apparatus of the present embodiment has the function of automatically adding a command for carrying out the communication of the information or the signal among the plural manufacturing apparatuses when the common program is converted into the operation programs for the manufacturing apparatuses. The function will now be described with reference to examples.

Figure 6:
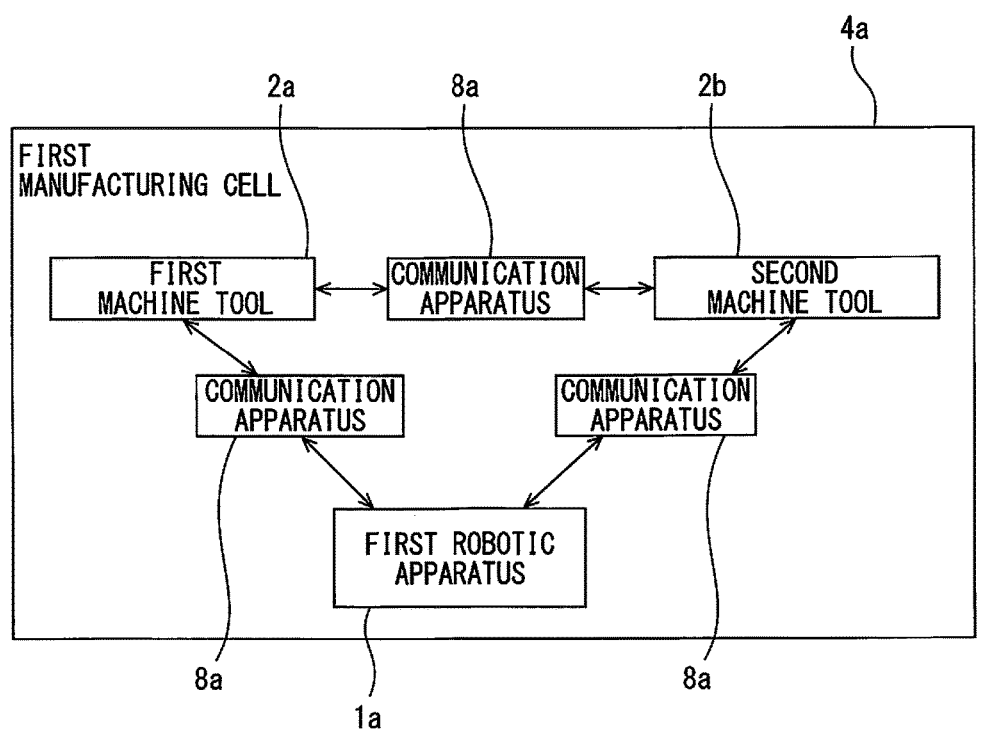
FIG. 6 is a block diagram of first manufacturing cell in second manufacturing system in an embodiment.

FIG. 6 is a block diagram of first manufacturing cell in second manufacturing system in the present embodiment. First manufacturing cell 4a includes first machine tool 2a, second machine tool 2b, and first robotic apparatus 1a. The machine tools 2a, 2b and the robotic apparatus 1a are formed to be capable of communicating with each other through a communication apparatus 8a. When the machine tools and the robotic apparatus are connected to each other, the PLC does not need to be arranged in the manufacturing cell.

Figure 7:
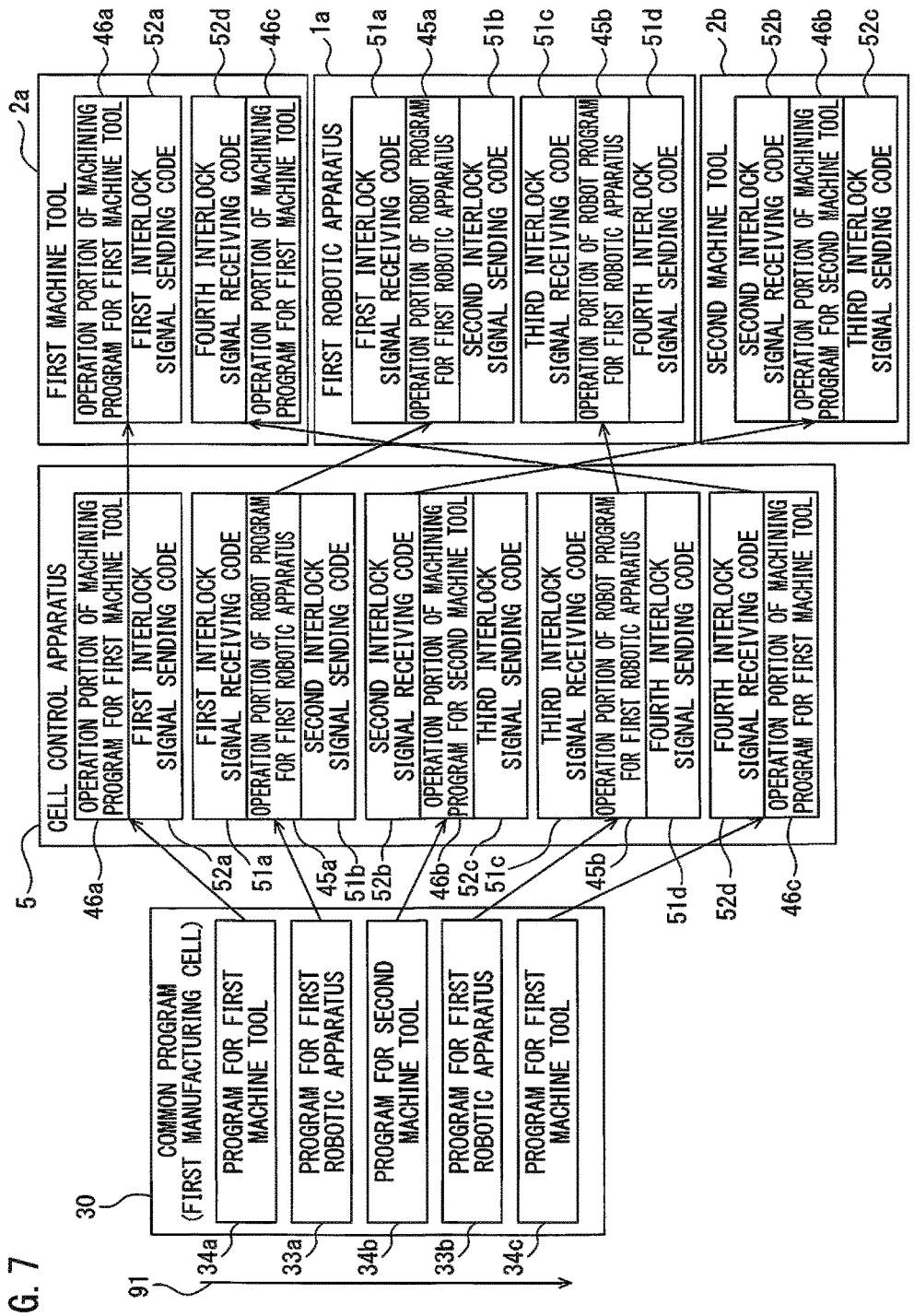
FIG. 7 is a block diagram for explaining control of generation of operation programs for the second manufacturing system.

FIG. 7 shows a block diagram for explaining control of generation of programs in the second manufacturing system. A program for the first manufacturing cell 4a is described. A common program 30 includes a program 34a for the first machine tool, a program 33a for the first robotic apparatus, a program 34b for the second machine tool, a program 33b for the first robotic apparatus, and a program 34c for the first machine tool.

In the example represented in FIG. 7, the common program 30 is described in the actual operation sequence as indicated by an arrow 91. For example, first, the first machine tool 2a works a workpiece, and the first robotic apparatus 1a then moves the workpiece to the second machine tool 2b. The second machine tool 2b carries out working, and thereafter the first robotic apparatus 1a moves the workpiece to the first machine tool 2a. The first machine tool 2a works the workpiece.

When operation programs for manufacturing apparatuses are generated, the conversion part 23 in the cell control apparatus 5 in the second manufacturing system automatically adds codes for sending or reception of interlock signals to the operation programs. The interlock signals are signals for controlling the operation or stopping of the manufacturing apparatuses to allow the manufacturing apparatuses to carry out operations in predetermined sequences.

When the operation by first manufacturing apparatus and the operation by second manufacturing apparatus are present and the operations are consecutive, the conversion part 23 automatically adds the code for sending the interlock signal indicating the completion of the operation of the first manufacturing apparatus to the second manufacturing apparatus, to the earlier executed operation program for the first manufacturing apparatus. The conversion part 23 automatically adds the code for waiting until the interlock signal is received from the first manufacturing apparatus, to the subsequently executed operation program for the second manufacturing apparatus.

For the first machine tool 2a, the conversion part 23 generates an operation portion 46a of the machining program for the first machine tool based on the program 34a for the first machine tool. The operation portion of the machining program is a portion in which a command for allowing the manufacturing apparatus to carry out the operation is described in the operation program. The conversion part 23 adds first interlock signal sending code 52a to the back of the operation portion 46a of the machining program for the first machine tool. A command for, when an operation based on the operation portion 46a of the machining program for the first machine tool is ended, sending the end of the operation to the first robotic apparatus, is described in the first interlock signal sending code 52a.

The conversion part 23 combines the operation portion 46a of the machining program for the first machine tool and the first interlock signal sending code 52a to generate the machining program for the first machine tool. The generated machining program for the first machine tool is sent to the first machine tool 2a. For the first robotic apparatus, the conversion part 23 generates an operation portion 45a of the robot program for the first robotic apparatus based on the program 33a for the first robotic apparatus. The conversion part 23 adds first interlock signal receiving code 51a to the front of the operation portion 45a of the robot program for the first robotic apparatus. A command for waiting until first interlock signal is received from the first machine tool 2a is described in the first interlock signal receiving code 51a. The conversion part 23 adds second interlock signal sending code 51b to the back of the operation portion 45a of the robot program for the first robotic apparatus. A command for sending the end of the operation of the first robotic apparatus to the second machine tool 2b is described in the second interlock signal sending code 51b.

The conversion part 23 combines the operation portion 45a of the robot program for the first robotic apparatus, the first interlock signal receiving code 51a, and the second interlock signal sending code 51b so as to generate the robot program for the first robotic apparatus. The cell control apparatus 5 sends the robot program for the first robotic apparatus to the first robotic apparatus 1a.

As described above, the sending code for sending a signal for the end of the operation is added to the last of the operation program for the manufacturing apparatus for the former operation, and the receiving code for receiving the sending code is added to the beginning of the operation program for a manufacturing apparatus for the latter operation. The operation program to which the code for the interlock signal is added is sent to a corresponding manufacturing apparatus.

For operations later than the operation based on the program 33a for the first robotic apparatus, the conversion part 23 similarly carries out control of addition of the interlock signal sending code or the interlock signal receiving code. For the second machine tool 2b, the conversion part 23 generates an operation portion 46b of the machining program for the second machine tool based on the program 34b for the second machine tool. The conversion part 23 adds second interlock signal receiving code 52b to the front of the operation portion 46b of the machining program for the second machine tool. In addition, the conversion part 23 adds third interlock signal sending code 52c to the back of the operation portion 46b of the machining program for the second machine tool. The machining program for the second machine tool is generated by combining the second interlock signal receiving code 52b, the operation portion 46b of the machining program for the second machine tool, and the third interlock signal sending code 52c. The machining program for the second machine tool is sent to the second machine tool 2b.

Then, the conversion part 23 generates an operation portion 45b of the robot program for the first robotic apparatus based on the program 33b for the first robotic apparatus. The conversion part 23 adds third interlock signal receiving code 51c and fourth interlock signal sending code 51d to the operation portion 45b of the robot program for the first robotic apparatus so as to generate the robot program for the first robotic apparatus. The generated robot program for the first robotic apparatus is sent to the first robotic apparatus 1a.

Next, the conversion part 23 generates an operation portion 46c of the machining program for the first machine tool based on a program 34c for the first machine tool. The conversion part 23 generates the machining program for the first machine tool by adding fourth interlock signal receiving code 52d to the front of the operation portion 46c of the machining program for the first machine tool. The cell control apparatus 5 sends the machining program for the first machine tool to the first machine tool 2a.

When the first manufacturing cell illustrated in FIG. 7 is driven, first, the first machine tool 2a works a workpiece by control described in the operation portion 46a of the machining program for the first machine tool. After the working of the workpiece is completed, the first machine tool 2a sends first interlock signal to the first robotic apparatus 1a. The first robotic apparatus 1a waits until receiving the first interlock signal. The first robotic apparatus 1a receives the first interlock signal, and then starts the operation based on the operation portion 45a of the robot program for the first robotic apparatus. The first robotic apparatus 1a sends second interlock signal to the second machine tool 2b after the end of the operation.

The second machine tool 2b receives the second interlock signal, and then starts working of the workpiece based on the operation portion 46b of the machining program for the second machine tool. The second machine tool 2b sends the third interlock signal to first robotic apparatus 1a after the end of the working of the workpiece.

Then, the first robotic apparatus 1a receives the third interlock signal, and then carries out an operation described in the operation portion 45b of the robot program for the first robotic apparatus. The first robotic apparatus 1a sends fourth interlock signal to the first machine tool 2a after the end of the operation. The first machine tool 2a receives the fourth interlock signal, and then carries out an operation based on the operation portion 46c of the machining program for the first machine tool.

As described above, the cell control apparatus 5 automatically adds commands for sending and receiving interlock signals for plural manufacturing apparatuses to operation programs in the second manufacturing system of the present embodiment. The operator does not need to describe, in the common program 30, the commands for sending and receiving the interlock signals among the plural manufacturing apparatuses. The operator may describe commands for operating the manufacturing apparatuses in the common program 30. Therefore, the effort of the operator to generate and correct the common program can be reduced. Alternatively, the incorrect setting of the interlocks of the manufacturing apparatuses by the operator can be avoided.

Figure 8:
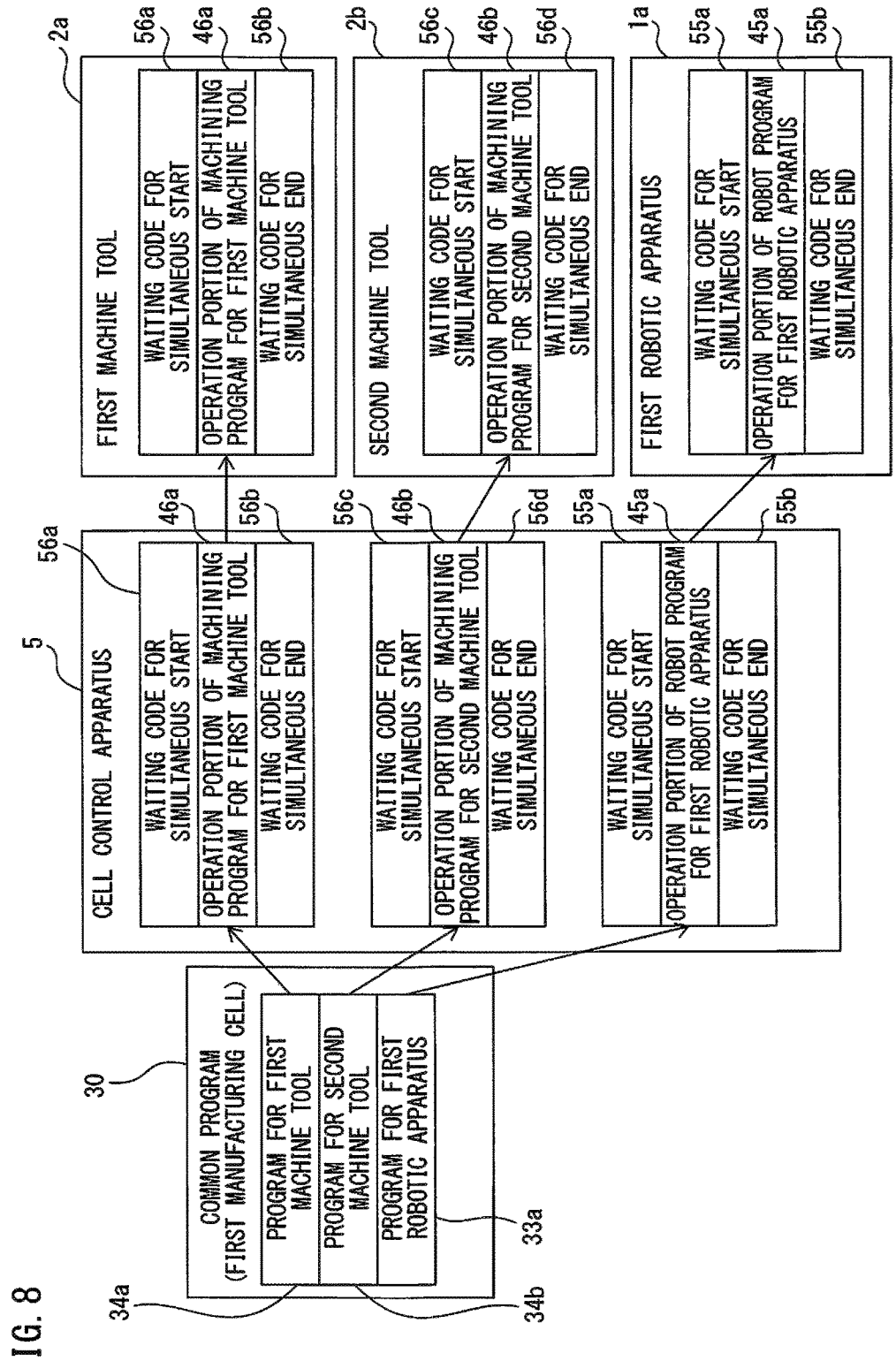
FIG. 8 is a block diagram for explaining control of generation of operation programs for third manufacturing system in an embodiment.

FIG. 8 shows a schematic view for explaining control of generation of operation programs for third manufacturing system in the present embodiment. In the third manufacturing system, plural manufacturing apparatuses carry out the control of simultaneously starting and simultaneously ending predetermined steps. When the operation of one manufacturing apparatus in the plural manufacturing apparatuses is ended, the one manufacturing apparatus carries out the control of waiting until the operations of all the other manufacturing apparatuses are ended. The operator describes the command for the plural manufacturing apparatuses to simultaneously start and further simultaneously end the predetermined steps in a common program 30. The conversion part 23 in a cell control apparatus 5 reads the command, thereby adding a waiting code for simultaneous start and a waiting code for simultaneous end to each operation programs.

The third manufacturing system in the present embodiment comprises the first manufacturing cell 4a as illustrated in FIG. 6. Control of the first manufacturing cell 4a is described. The common program 30 includes a program 34a for the first machine tool, a program 34b for the second machine tool, and a program 33a for the first robotic apparatus.

For the first machine tool 2a, the conversion part 23 in the cell control apparatus 5 converts the program 34a for the first machine tool into the operation portion 46a of the machining program for the first machine tool. The conversion part 23 adds a waiting code 56a for simultaneous start to the front of the operation portion 46a of the machining program for the first machine tool based on the command for simultaneously starting the steps. The conversion part 23 adds a waiting code 56b for simultaneous end to the back of the operation portion 46a of the machining program for the first machine tool based on the command for simultaneously ending the steps. The operation portion 46a of the machining program for the first machine tool, the waiting code 56a for simultaneous start, and the waiting code 56b for simultaneous end are combined so as to generate the machining program for the first machine tool. The cell control apparatus 5 sends this machining program to the first machine tool 2a.

With regard to the second machine tool, the conversion part 23 similarly converts the program 34b for the second machine tool into the operation portion 46b of the machining program for the second machine tool. The conversion part 23 adds a waiting code 56c for simultaneous start to the front of the operation portion 46b of the machining program for the second machine tool. The conversion part 23 adds a waiting code 56d for simultaneous end to the back of the operation portion 46b of the machining program for the second machine tool. The cell control apparatus 5 sends this machining program to the second machine tool 2b.

With regard to the first robotic apparatus, the conversion part 23 similarly converts the program 33a for the first robotic apparatus into the operation portion 45a of the robot program for the first robotic apparatus. The conversion part 23 adds a waiting code 55a for simultaneous start and a waiting code 55b for simultaneous end so as to generate the robot program for the first robotic apparatus 1a. The cell control apparatus 5 sends this robot program to the first robotic apparatus 1a.

The first machine tool 2a, the second machine tool 2b, and the first robotic apparatus 1a communicate with one another. The plural manufacturing apparatuses simultaneously start the operations based on the waiting codes 56a, 56c, and 55a for simultaneous start.

The first machine tool 2a carries out the operation based on the operation portion 46a of the machining program for the first machine tool. The second machine tool 2b carries out the operation based on the operation portion 46b of the machining program for the second machine tool. The first robotic apparatus 1a carries out the operation based on the operation portion 45a of the robot program for the first robotic apparatus. Any manufacturing apparatus, when ending the operation, waits without shifting to the next operation until the operations of the other manufacturing apparatuses are ended.

For example, the first machine tool 2a waits without shifting to the next operation when ending the operation earlier than the second machine tool 2b and the first robotic apparatus 1a. Then, the second machine tool 2b waits without shifting to the next operation when the second machine tool 2b ends the operation. Finally, when the first robotic apparatus 1a ends the operation, it can be judged that the operations of all the manufacturing apparatuses are ended. This judgement can be carried out in each manufacturing apparatus. Alternatively, a PLC may carry out the judgement when the PLC is arranged in the manufacturing cell. When the operations of all the manufacturing apparatuses are ended, the first machine tool 2a, the second machine tool 2b, and the first robotic apparatus 1a shift to the next steps.

In the third manufacturing system, the conversion part 23 automatically adds the waiting code by describing the command for the operator to simultaneously start steps and the command for the operator to simultaneously end steps in the common program, as described above. The operator does not need to describe the command for carrying out communications between the manufacturing apparatuses to simultaneously carry out steps in the common program. In addition to the command for the operation of each manufacturing apparatus, the operator may describe a command for simultaneously carrying out steps, and the effort to generate or correct the common program can be reduced.

The plural manufacturing apparatuses carry out the control of simultaneously starting the steps and further simultaneously ending the steps in the example described above. However, the embodiment is not limited to this, and either one of the control of simultaneous start and the control of simultaneous end may be carried out.

Figure 9:
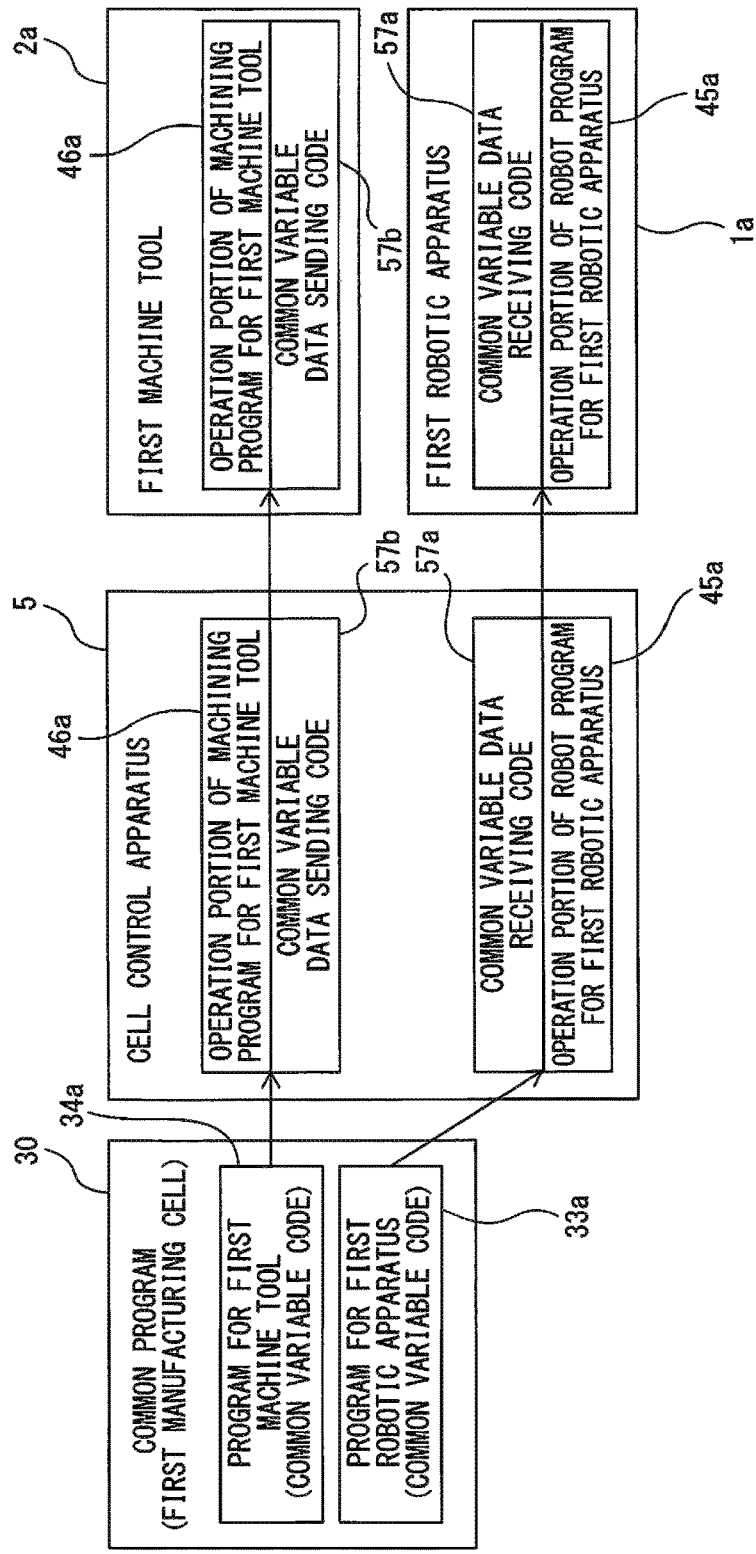
FIG. 9 is a block diagram for explaining control of generation of operation programs for fourth manufacturing system in an embodiment.

FIG. 9 shows a schematic view for explaining control of generation of operation programs in fourth manufacturing system in the present embodiment. In the fourth manufacturing system, the information of a common variable which is shared among manufacturing apparatuses is sent and received. The common variable is a common variable used in the plural manufacturing apparatuses. The plural manufacturing apparatuses can receive and transmit the information on the common variable with one another.

An example of the common variable includes the location of an arbitrary portion. The example of the information of common variable includes location data. For example, the location data can be formed by a coordinate value in the world coordinate system.

The fourth manufacturing system is described with reference to an example in which the first machine tool 2a and the first robotic apparatus 1a are arranged in the first manufacturing cell 4a. The first machine tool 2a and the first robotic apparatus 1a are formed to be capable of communicating with each other through the communication apparatus 8a. The program 34a for the first machine tool and the program 33a for the first robotic apparatus are described in the common program 30. Coordinate values in the world coordinate system are set as common variables in the program 34a for the first machine tool and the program 33a for the first robotic apparatus.

In the fourth manufacturing system, the first machine tool 2a works a workpiece, and the first robotic apparatus 1a then carries out the operation of taking out the workpiece from the first machine tool 2a. At this time, the first machine tool 2a can calculate the location of the workpiece at the time of ending the working based on the location of a table to which the workpiece is fixed. The first machine tool 2a sends the location data of the workpiece to the first robotic apparatus 1a. Based on the received location data, the first robotic apparatus 1a can determine a position and a posture of the robot and the hand when the workpiece arranged on the table of first machine tool 2a is taken out.

The operator describes common variables as commands in the common program 30. The conversion part 23 of the cell control apparatus 5 adds a sending code for sending the information of the common variables or a receiving code for receiving the common variables to the operation program based on the descriptions of the common variables.

The conversion part 23 acquires the common variables from the program 34a for the first machine tool and the program 33a for the first robotic apparatus. The conversion part 23 converts the program 34a for the first machine tool into the operation portion 46a of the machining program for the first machine tool. At this time, the conversion part 23 adds a common variable data sending code 57b to the back of the operation portion 46a of the machining program for the first machine tool. The command for sending the location data of the workpiece from the first machine tool 2a to the first robotic apparatus 1a is described in the common variable data sending code 57b. The operation portion 46a of the machining program for the first machine tool and the common variable data sending code 57b are combined to form the machining program for the first machine tool 2a. This machining program is sent to the first machine tool 2a.

The conversion part 23 converts the program 33a for the first robotic apparatus into the operation portion 45a of the robot program for the first robotic apparatus. At this time, the conversion part 23 adds a common variable data receiving code 57a to the front of the operation portion 45a of the robot program for the first robotic apparatus. The command for receiving the location data of the workpiece from the first machine tool 2a is described in the common variable data receiving code 57a. The operation portion 45a of the robot program for the first robotic apparatus and the common variable data receiving code 57a are combined to form the robot program for the first robotic apparatus 1a. The robot program is sent to the first robotic apparatus 1a.

When the operation is started, the first machine tool 2a carries out working of the workpiece based on the operation portion 46a of the machining program for the first machine tool. When the working of the workpiece is completed, the first machine tool 2a sends the location data of the workpiece at the time of ending the working to the first robotic apparatus 1a based on the common variable data sending code 57b. The first robotic apparatus 1a receives the location data of the workpiece based on the common variable data receiving code 57a. The first robotic apparatus 1a sets the position and the posture of the robot and the hand based on the location data of the workpiece. The first robotic apparatus 1a carries out an operation of taking out the workpiece from the first machine tool 2a based on the operation portion 45a of the robot program for the first robotic apparatus.

As described above, the conversion part of the present embodiment automatically adds the common variable data sending code or the common variable data receiving code to the operation program based on the common variable described in the common program. The operator does not need to describe the command for sending or receiving the common variable in the common program, and the effort to generate or correct the common program can be reduced.

The machine tool sends the common variable data, and the robotic apparatus receives the common variable data in the embodiment described above. However, the embodiment is not limited to this, and the robotic apparatus may send common variable data and the machine tool may receive the common variable data based on the predetermined operation.

The control of automatically adding the common variable data sending or receiving code can be carried out by setting an arbitrary variable to the common variable. For example, the shape of the workpiece can be set as the common variable. The robotic apparatus can measure the shape of the workpiece by arranging a contact sensor in the hand. The shape of an actual workpiece includes a manufacturing error. The robotic apparatus can send the data of the shape of the workpiece as the common variable data to the machine tool. The machine tool can carry out control of correcting the location of the tool for working based on the shape of the actual workpiece.

The manufacturing system of the present embodiment comprises two manufacturing cells. However, the embodiment is not limited to this, and the present invention can also be applied to a manufacturing system comprising three or more manufacturing cells. The present invention can also be applied to a manufacturing system comprising plural manufacturing apparatuses to which a manufacturing cell is not set.

The cell control apparatus has the function of a program generation apparatus that generates programs for operating manufacturing apparatuses in the present embodiment. However, the embodiment is not limited to this, and a program generation apparatus having CPU and the like may be arranged separately from the cell control apparatus. In such a case, the cell control apparatus can acquire programs for manufacturing apparatuses, generated by the program generation apparatus, and can send the operation programs to respective manufacturing apparatuses.

The manufacturing apparatuses included in the manufacturing cells of the present embodiment are the machine tools which work a workpiece, the robotic apparatuses which attach the workpiece to the machine tools, and the PLC which controls the machine tools and the robotic apparatuses. The embodiment is not limited to this, and the apparatus which carries out an arbitrary operation to manufacture a product can be adopted as a manufacturing apparatus. Examples of manufacturing apparatuses include a conveying apparatus which conveys a workpiece, a coating apparatus which carries out coating, a welding apparatus which carries out welding, and a printing apparatus which carries out printing.

According to the present invention, there can be provided the manufacturing system in which operation programs for plural types of manufacturing apparatuses can be easily generated or corrected.

The embodiments described above can be combined as appropriate. The same or equivalent portions are denoted by the same reference characters in each of the drawings described above. The embodiments described above are mentioned as examples, and do not limit the invention. Further, the embodiments include modifications of the embodiments, described in the scope of the claims.

The invention claimed is:

1. A manufacturing system, comprising:
    plural manufacturing apparatuses driven by operation programs of which language specifications differ from each other;
    a program generation apparatus generating operation programs to be executed in the manufacturing apparatuses;
    sending apparatuses sending the operation programs generated by the program generation apparatus to the respective manufacturing apparatuses; and
    communication apparatuses carrying out communications among the manufacturing apparatuses, wherein
    a language specification common to the manufacturing apparatuses of which the language specifications of the operation programs differ from each other is predetermined,
    the program generation apparatus includes
        a reading part reading a common program generated based on the common language specification, and
        a conversion part converting the common program into the operation programs of the respective manufacturing apparatuses,
    the conversion part has a function of automatically adding a command to carry out a communication of information or a signal among the manufacturing apparatuses when the common program is converted into the operation programs of the manufacturing apparatuses, and
    the manufacturing system further comprises a simulation apparatus executing a simulation of the common program input to the program generation apparatus.

2. A manufacturing system, comprising:
    plural manufacturing apparatuses driven by operation programs of which language specifications differ from each other;
    a program generation apparatus generating operation programs to be executed in the manufacturing apparatuses;
    sending apparatuses sending the operation programs generated by the program generation apparatus to the respective manufacturing apparatuses; and
    communication apparatuses carrying out communications among the manufacturing apparatuses, wherein
    a language specification common to the manufacturing apparatuses of which the language specifications of the operation programs differ from each other is predetermined,
    the program generation apparatus includes
        a reading part reading a common program generated based on the common language specification, and a conversion part converting the common program into the operation programs of the respective manufacturing apparatuses, the manufacturing apparatuses include first and second manufacturing apparatuses, the common program includes
- a first program of a first operation to be performed by the first manufacturing apparatus, and
- a second program of a second operation to be performed by the second manufacturing apparatus after the first operation, the conversion part of the program generation apparatus
- converting the first program in a common language of the common language specification into a first operation portion in a first language of a first language specification of the first manufacturing apparatus,
- converting the second program in the common language into a second operation portion in a second language of a second language specification of the second manufacturing apparatus, the second language different from the first language,
- automatically adding an interlock signal sending code to the first operation portion to obtain a first operation program in the first language, and sending the first operation program to the first manufacturing apparatus, and
- automatically adding an interlock signal receiving code to the second operation portion to obtain a second operation program in the second language, and sending the second operation program to the second manufacturing apparatus, the first operation program, when executed by the first manufacturing apparatus, causes the first manufacturing apparatus to
- perform the first operation in accordance with the first operation portion in the first operation program, and then
- in accordance with the interlock signal sending code, send an interlock signal to the second manufacturing apparatus upon completing the first operation, and the second operation program, when executed by the second manufacturing apparatus, causes the second manufacturing apparatus to
- in accordance with the interlock signal receiving code, wait for the interlock signal from the first manufacturing apparatus, and then
- perform the second operation in accordance with the second operation portion in the second operation program, in response to receipt of the interlock signal from the first manufacturing apparatus.

3. The manufacturing system according to claim 1, wherein the manufacturing apparatuses include first and second manufacturing apparatuses, the common program includes
- a first program of a first operation to be performed by the first manufacturing apparatus, and
- a second program of a second operation to be performed by the second manufacturing apparatus and to start simultaneously with a start of the first operation, the conversion part of the program generation apparatus
- converting the first program in a common language of the common language specification into a first operation portion in a first language of a first language specification of the first manufacturing apparatus,
- converting the second program in the common language into a second operation portion in a second language of a second language specification of the second manufacturing apparatus, the second language different from the first language,
- automatically adding a waiting code for simultaneous start to the first operation portion to obtain a first operation program in the first language, and sending the first operation program to the first manufacturing apparatus, and
- automatically adding the waiting code for simultaneous start to the second operation portion to obtain a second operation program in the second language, and sending the second operation program to the second manufacturing apparatus, and the first and second operation programs, when executed by the first and second manufacturing apparatuses, respectively, cause the first and second manufacturing apparatuses to, in accordance with the waiting code for simultaneous start, simultaneously start performing the first operation in accordance with the first operation portion in the first operation program and the second operation in accordance with the second operation portion in the second operation program.

4. The manufacturing system according to claim 1, wherein the manufacturing apparatuses include first and second manufacturing apparatuses, the common program includes
- a first program of a first operation to be performed by the first manufacturing apparatus, and
- a second program of a second operation to be performed by the second manufacturing apparatus and to end simultaneously with an end of the first operation, the conversion part of the program generation apparatus
- converting the first program in a common language of the common language specification into a first operation portion in a first language of a first language specification of the first manufacturing apparatus,
- converting the second program in the common language into a second operation portion in a second language of a second language specification of the second manufacturing apparatus, the second language different from the first language,
- automatically adding a waiting code for simultaneous end to the first operation portion to obtain a first operation program in the first language, and sending the first operation program to the first manufacturing apparatus, and
- automatically adding the waiting code for simultaneous end to the second operation portion to obtain a second operation program in the second language, and sending the second operation program to the second manufacturing apparatus, and the first and second operation programs, when executed by the first and second manufacturing apparatuses, respectively, cause the first and second manufacturing apparatuses to
- perform the first operation in accordance with the first operation portion in the first operation program and the second operation in accordance with the second operation portion in the second operation program, and
- in accordance with the waiting code for simultaneous end, simultaneously end the first and second operations.

5. The manufacturing system according to claim 1, wherein
the manufacturing apparatuses include first and second manufacturing apparatuses,
the common program includes
a first program of a first operation to be performed by the first manufacturing apparatus, and
a second program of a second operation to be performed by the second manufacturing apparatus and to start and end simultaneously with the first operation,
the conversion part of the program generation apparatus
converting the first program in a common language of the common language specification into a first operation portion in a first language of a first language specification of the first manufacturing apparatus,
converting the second program in the common language into a second operation portion in a second language of a second language specification of the second manufacturing apparatus, the second language different from the first language,
automatically adding a waiting code for simultaneous start and a waiting code for simultaneous end to the first operation portion to obtain a first operation program in the first language, and sending the first operation program to the first manufacturing apparatus, and
automatically adding the waiting code for simultaneous start and the waiting code for simultaneous end to the second operation portion to obtain a second operation program in the second language, and sending the second operation program to the second manufacturing apparatus, and
the first and second operation programs, when executed by the first and second manufacturing apparatuses, respectively, cause the first and second manufacturing apparatuses to
in accordance with the waiting code for simultaneous start, simultaneously start performing the first operation in accordance with the first operation portion in the first operation program and the second operation in accordance with the second operation portion in the second operation program, and
in accordance with the waiting code for simultaneous end, simultaneously end the first and second operations.

6. A manufacturing system, comprising:
plural manufacturing apparatuses driven by operation programs of which language specifications differ from each other;
a program generation apparatus generating operation programs to be executed in the manufacturing apparatuses;
sending apparatuses sending the operation programs generated by the program generation apparatus to the respective manufacturing apparatuses; and
communication apparatuses carrying out communications among the manufacturing apparatuses, wherein
a language specification common to the manufacturing apparatuses of which the language specifications of the operation programs differ from each other is predetermined,
the program generation apparatus includes
a reading part reading a common program generated based on the common language specification, and
a conversion part converting the common program into the operation programs of the respective manufacturing apparatuses,
the manufacturing apparatuses include first and second manufacturing apparatuses,
the common program includes
a first program of a first operation to be performed by the first manufacturing apparatus,
a second program of a second operation to be performed by the second manufacturing apparatus, and
a common variable to be shared by the first and second manufacturing apparatuses to perform the first and second operations, respectively,
the conversion part of the program generation apparatus
converting the first program in a common language of the common language specification into a first operation portion in a first language of a first language specification of the first manufacturing apparatus,
converting the second program in the common language into a second operation portion in a second language of a second language specification of the second manufacturing apparatus, the second language different from the first language,
automatically adding a common variable data sending code to the first operation portion to obtain a first operation program in the first language, and sending the first operation program to the first manufacturing apparatus, and
automatically adding a common variable data receiving code to the second operation portion to obtain a second operation program in the second language, and sending the second operation program to the second manufacturing apparatus,
the first operation program, when executed by the first manufacturing apparatus, causes the first manufacturing apparatus to
perform the first operation in accordance with the first operation portion in the first operation program, and then
in accordance with the common variable data sending code, send data of the common variable obtained during the first operation to the second manufacturing apparatus, and
the second operation program, when executed by the second manufacturing apparatus, causes the second manufacturing apparatus to
in accordance with the common variable data receiving code, receive the data of the common variable obtained during the first operation from the first manufacturing apparatus, and
based on the data of the common variable received from the first manufacturing apparatus, perform the second operation in accordance with the second operation portion in the second operation program.

* * * * *